Sept. 6, 1966

J. M. HIRSHON ETAL 3,271,555

HANDLING AND BONDING APPARATUS

Filed March 29, 1965

INVENTORS.
JACK M. HIRSHON
PHILIP D. WARNER
BY
ATTORNEY

United States Patent Office 3,271,555

Patented Sept. 6, 1966

3,271,555

HANDLING AND BONDING APPARATUS

Jack M. Hirshon, Doylestown, Pa., and Philip D. Warner, Melville, N.Y., assignors to International Resistance Company, Philadelphia, Pa.

Filed Mar. 29, 1965, Ser. No. 443,330
8 Claims. (Cl. 219—85)

The present invention relates to a handling and bonding apparatus and more particularly to an apparatus for use in positioning miniaturized electrical components, particularly semiconductor chips or devices, on a supporting plate and bonding the terminals of the electrical components to conductors on the plate.

In our co-pending application for United States Letters Patent Serial No. 410,182, filed November 10, 1964, entitled "Semiconductor Device and Method of Making the Same," there is shown and described a semiconductor device comprising a thin, flat disk of a semiconductor material having one or more P-N junctions formed therein and metal terminal straps electrically connected to opposite sides of the junctions and projecting beyond the side edges of the disk. As stated in said application Serial No. 410,182, the semiconductor device is adapted to be mounted on a supporting plate, such as a base header or a base plate of microcircuit assembly, with the terminal straps being bonded, such as by soldering, to either the terminal wires of the base header or the metal circuit paths on the base plate of the microcircuit assembly. In view of the extremely small size of these semiconductor devices, which can be as small as .010 inch on each side and .003 in thickness, a problem arises in the handling of the devices for the purpose of properly mounting the devices on a supporting plate and bonding the terminal straps to either the terminal wires or circuit paths.

It is a object of the present invention to provide a novel handling and bonding apparatus.

It is another object of the present invention to provide an apparatus for positioning miniaturized electrical components on a supporting plate and bonding the terminals of the component to conductors on the supporting plate.

It is a further object of the present invention to provide an apparatus which will pick up miniaturized electrical components, particularly semiconductor chips or devices, position the components on a supporting plate, and bond the terminals of the components to conductors on the supporting plate while holding the components in position on the supporting plate.

Other objects will appear hereinafter.

For the purpose of illustrating the invention there is shown in the drawings a form which is presently preferred; it being understood, however, that this invention is not limited to the precise arrangements and instrumentalities shown.

Figures 1, 2, 3, 4:
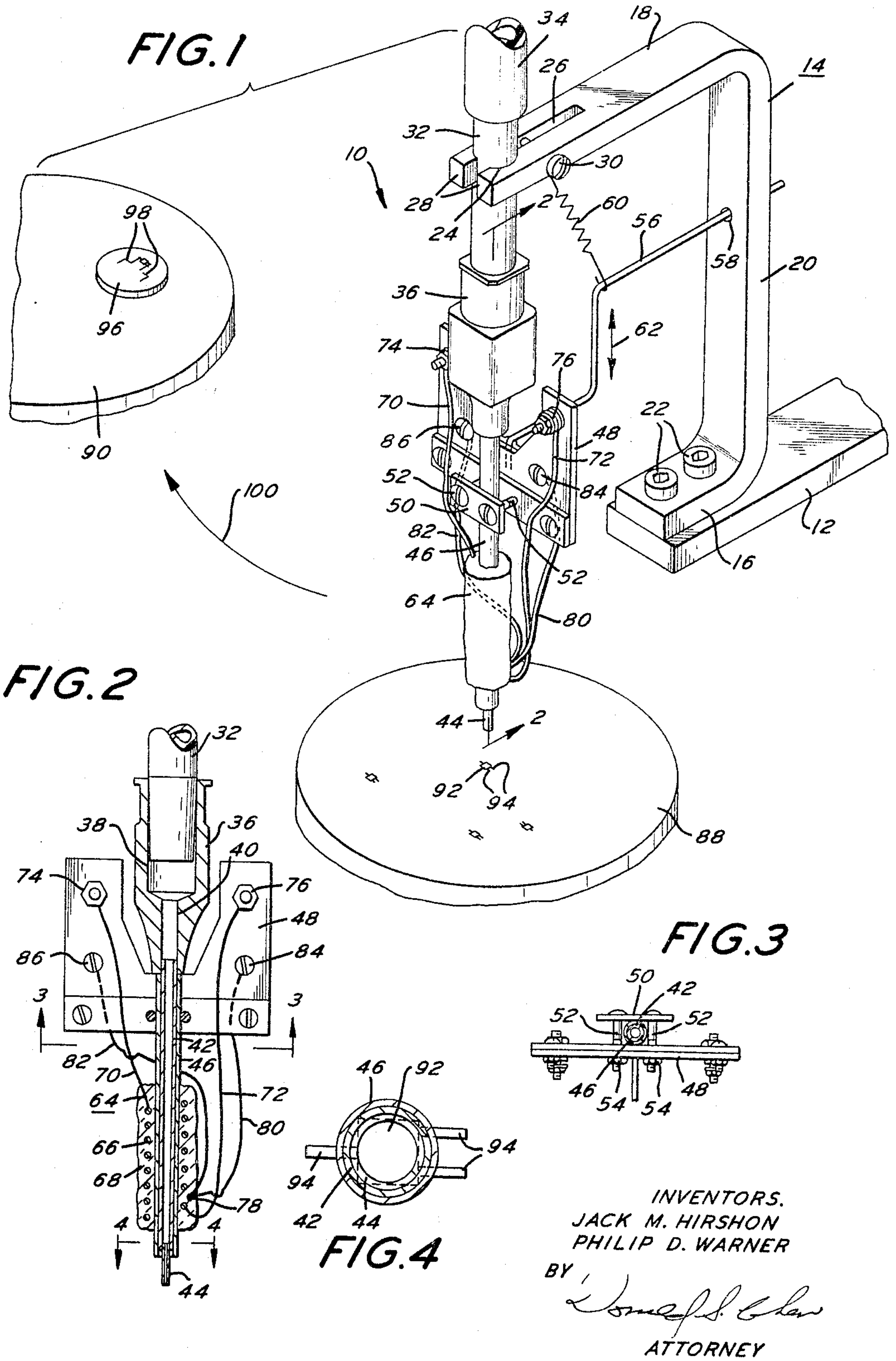
FIGURE 1 is a perspective view of the apparatus of the present invention.
FIGURE 2 is a sectional view taken along line 2—2 of FIGURE 1.
FIGURE 3 is a sectional view taken along line 3—3 of FIGURE 2.
FIGURE 4 is a sectional view taken along line 4—4 of FIGURE 2 with the apparatus being positioned over a semiconductor device.

Referring initially to FIGURE 1, the apparatus of the present invention is generally designated as 10.

Apparatus 10 comprising a horizontally disposed supporting arm 12 which is mounted at its rear end on any suitable mechanical means, not shown, for selectively moving the arm vertically and for pivoting the arm in a horizontal plane. A U-shaped bracket 14 is mounted on the front end of the supporting arm 12. Bracket 14 has a pair of vertically spaced, parallel, horizontally extending legs

16 and 18 and a vertical leg 20 extending between and connecting the horizontal legs 16 and 18. The bottom horizontal leg 16 of the bracket 14 is seated on the top surface of the supporting arm 12 at the front end of the arm, and is secured to the arm 12 by screws 22. The upper horizontal leg 18 of the bracket 14 is longer than the bottom leg 16 so that it projects beyond the front end of the supporting arm 12. Leg 18 has a round hole 24 extending vertically therethrough adjacent its front end, and a slit 26 therethrough extending longitudinally therealong from its front end and across the hole 24. The slit 26 divides the front end of the leg 18 into two clamping arms 28. A headed screw 30 extends through one of the clamping arms 28, crosses the slit 26 and is threaded into the other clamping arm.

A rigid pipe 32 extends vertically through the hole 24 in the bracket leg 18. The clamping arms 28 are clamped tightly against the pipe 32 by means of the screws 30 so as to secure the pipe to the bracket 14. A flexible hose 34 is secured to the top end of the pipe 32. The hose 34 is connected to any well-known means, not shown, for drawing air vertically upward through the pipe 32, such as a vacuum pump.

An adaptor 36 is mounted on the bottom end of the pipe 32. As shown in FIGURE 2, adaptor 36 has a passage 38 in its upper end which is of a diameter equal to the outer diameter of the pipe 32 so that the pipe fits tightly within the passage to secure the adaptor 36 to the pipe. The adaptor 36 has another passage 40, smaller in diameter than the diameter of passage 38, extending from the bottom end of passage 38 to the bottom end of the adaptor. A cylindrical tube 42 is secured at its upper end within the bottom end of the passage 40 of the adaptor, and extends downwardly from the adaptor in vertical alignment with the pipe 32. A hollow, cylindrical tip 44 is secured within the bottom end of the tube 42 and projects therefrom.

A cylindrical heater sleeve 46 of a thermally conductive metal surrounds the tube 42. The internal diameter of the sleeve 46 is slightly larger than the external diameter of the tube 42 so that the sleeve can slide longitudinally along the tube. The length of the sleeve 46 is shorter than the combined lengths of the tube 42 and the tip 44. A supporting plate 48 of an electrical insulating material, such as a plastic, extends tangentially across the upper end of the sleeve 46 on the side of the sleeve toward the vertical leg 20 of the bracket 14. A clamping strap 50 extends tangentially across the side of the sleeve 46 diametrically opposite the supporting plate 48, and a pair of bolts 52 extend through the clamping straps and supporting plate 48 on diametrically opposite sides of the sleeve. As shown in FIGURE 3, nuts 54 are threaded on the ends of the bolts 52 to clamp the sleeve 46 tightly between the clamping straps 50 and the supporting plate 48 and thereby secure the sleeve to the supporting plate.

As shown in FIGURE 1, a stiff wire 56 is secured at one end to the side of the supporting plate 48 away from the sleeve 44. The other end of the wire 56 extends horizontally through a hole 58 in the vertical leg 20 of the bracket 14. A helical spring 60 is secured at one end to the wire 56 and at its other end to the screw 30. The spring 60 is tensioned so that it normally pulls upwardly on the wire 56 to hold the upper end of the heater sleeve 46 against the bottom end of the adaptor 36 as shown in FIGURE 2. However, by pressing downwardly on the wire 56, the heater sleeve 46 can be slid downwardly along the tube 42. Thus, the heater sleeve 46 can be reciprocated vertically as indicated by the double headed arrow 62 in FIGURE 1 through the wire 56.

A heater 64 surrounds and is secured to the heater sleeve 46 adjacent the low end of the sleeve. As shown in FIGURE 2, heater 64 comprises a resistance wire 66 helically wound around the heater sleeve 46 and an electrically insulating cement 68 which will withstand high temperatures encasing the resistance wire and securing it to the sleeve 46. Terminal wires 70 and 72 are connected to opposite ends of the resistance wire 66 and extend to separate terminal studs 74 and 76 on the supporting plate 48. The terminal studs 74 and 76 are connected by suitable wiring across a source of electrical current, not shown. A thermocouple tip 78 is embedded in the cement 68 adjacent the resistance wire 66. The thermocouple 78 is connected by wires 80 and 82 to separate terminal studs 84 and 86 on the supporting plate 48. Terminal studs 84 and 86 are connected to suitable control means (not shown) for controlling the electrical current to the resistance wire 66 so as to control the temperature of the heater 64.

As shown in FIGURE 1, two work tables 88 and 90 are provided for use with the apparatus 10 of the present invention. The work tables 88 and 90 are arranged in spaced relation along the circumference of the article of rotation of the supporting arm 12. Work table 88 holds the electrical compounds 92 to be handled by the apparatus 10. As shown, the electrical components 92 are the semiconductor devices described in our said application Serial No. 410,182, which have metal terminal straps 94 extending beyond the side edges thereof. Work table 90 holds a supporting plate 96 on which the electrical component 92 is to be mounted and secured by the apparatus 10. As shown, supporting plate 96 is a microcircuit assembly having metal circuit paths 98 on the surface thereof to which the terminal straps 94 of the electrical component 92 are to be secured. Although two separate work tables are shown, the apparatus 10 can be used with a single work table which holds both the electrical components and the supporting plate.

In the use of the apparatus 10 of the present invention, the supporting arm 12 is pivoted until the tip 44 is directly over an electrical component 92 on the work table 88. The arm 12 is then lowered vertically until the end of the tip 44 contacts the electrical component 92. As shown in FIGURE 4, the internal diameter of the tip 44 is no greater than the dimensions of the electrical component 92 so that the electrical component completely covers the tip. The means for creating a vacuum to which the flexible hose 34 is connected is turned on to draw air upwardly through the tube 42. This draws the electrical component tightly against the end of the tip 44 and holds the component to the tip.

The supporting arm 12 is then moved upwardly and pivoted in the direction of arrow 100 (FIGURE 1) until the electrical component 92 held on the end of the tip 44 is directly over the supporting plate 96 on the work table 90. The supporting arm 12 is then lowered until the electrical component 92 is positioned on the supporting plate 96 and held thereon in preparation for bonding the terminal strips 94 of the component to the metal paths 98 on the supporting plate.

At the start of the operation, the electrical current to the heater resistance winding 66 is turned on to heat the heater 66. The heater 66 in turn heats the heater sleeve 46. As shown in FIGURE 4, the inner diameter of the heater sleeve 46 is larger than the dimensions of the electrical component 92. With the electrical component 92 being held on the supporting plate 96 by the tip 44, the wire 56 is pressed downwardly to slide the heater sleeve 46 downwardly along the tube 42. The end of the heater sleeve 46 engages the terminal straps 94 of the electrical component 92 and presses the terminal straps downwardly into engagement with the metal paths 98 on the supporting plate 96. The heater sleeve 46 also heats the terminal straps 96. By pre-coating either the terminal straps 96 or the metal paths 98 with solder, the heat from the heater sleeve 46 melts the solder and simultaneously bonds all of the terminal straps to the metal paths.

The downward pressure on the wire 56 is then released to permit the spring 60 to lift the heater sleeve 46 away from the electrical component 92. The source of vacuum is then cut off to release the electrical component 92 from the end of the tip 44. The supporting arm 12 is then raised to lift the tip 44 from the electrical component 92, and the arm is pivoted back to the work table 88 to repeat the operation. Thus, the apparatus 10 operates to pick up an electrical component, carry the component to a supporting plate, position the component on the supporting plate, and hold the component in position while bonding all of the terminals of the component simultaneously to conductors on the supporting plate.

The present invention may be embodied in other specific forms without departing from the spirit or essential attributes thereof and, accordingly, reference should be made to the appended claims, rather than to the foregoing specification as indicating the scope of the invention.

We claim:

1. An apparatus for positioning and bonding an electrical component to a supporting plate comprising an elongated, vertical tube, means at the upper end of said tube for connecting the tube to means for drawing air upwardly through said tube, a heater sleeve surrounding said tube and movable longitudinally along said tube, a heater surrounding and secured to said heater sleeve, means supporting the tube and the heater sleeve and adapted to move the tube and the heater sleeve in unison horizontally and vertically, and means independently supporting said heater sleeve on said first supporting means for longitudinal movement along said tube.

2. Apparatus in accordance with claim 1 in which the means independently supporting the heater sleeve includes resilient means normally holding the bottom end of the heater sleeve away from the bottom end of the tube.

3. Apparatus in accordance with claim 1 in which the heater comprises a resistance wire helically wound around the heater sleeve, an electrically insulating cement encasing the resistance wire and securing the resistance wire to the heater sleeve, and a separate terminal wire secured to each end of the resistance wire and extending from the cement.

4. An apparatus for positioning and bonding an electrical component to a supporting plate comprising a horizontally disposed supporting arm mounted for horizontal and vertical movement, a bracket mounted on the front end of said supporting arm, said bracket having a vertical leg extending upwardly from the supporting arm and a horizontal leg extending forwardly from the upper end of the vertical leg beyond the front end of said supporting arm, a vertical, rigid pipe secured to the front end of the vertical leg of said bracket, means at the upper end of said pipe for connecting the pipe to means for drawing air upwardly through the pipe, a vertically extending elongated tube secured to the bottom end of said pipe in alignment with said pipe, a heater sleeve slidably surrounding said tube, means supporting said heater sleeve on said bracket for longitudinal movement with respect to said tube, and a heater surrounding and secured to said heater sleeve.

5. Apparatus in accordance with claim 4 in which the means supporting the heater sleeve comprises a supporting plate of an electrical insulating material extending tangentially across the upper end of the heater sleeve on the side of the heater sleeve toward the vertical leg of the bracket, means securing the heater sleeve to said supporting plate, a stiff wire secured at one end to the supporting plate and extending horizontally through a hole in the vertical leg of the bracket, and a spring secured at one end to the wire and secured at its other end to the horizontal leg of the bracket, said spring normally applying a vertically, upwardly force on the wire so as to hold the bottom end of the heater sleeve above the bottom end of the tube.

6. Apparatus in accordance with claim 5 in which the heater comprises a resistance wire helically wound around the heater sleeve, a cement encasing the resistance wire and securing the resistance wire to the heater sleeve, and a separate terminal wire secured to each end of the resistance wire and projecting from the cement.

7. Apparatus in accordance with claim 6 including a pair of terminal studs secured to the supporting plate, and each of the terminal wires of the heater are connected to a separate one of said terminal studs.

8. Apparatus in accordance with claim 7 including a thermocouple embedded in the cement of the heater adjacent the resistance wire, a second pair of terminal studs secured to the supporting plate, and a pair of terminal wires extending from the thermocouple and connected to said secured pair of terminal studs.

References Cited by the Examiner

UNITED STATES PATENTS

| | | | |
|---|---|---|---|
| 2,569,250 | 9/1951 | Mims | 219—238 X |
| 3,083,291 | 3/1963 | Soffa et al. | 219—85 X |
| 3,165,818 | 1/1965 | Soffa et al. | 219—85 X |
| 3,211,884 | 10/1965 | Boller | 219—85 |

RICHARD M. WOOD, *Primary Examiner.*

B. A. STEIN, *Assistant Examiner.*